United States Patent [19]

Temple

[11] 4,261,001

[45] Apr. 7, 1981

[54] PARTIALLY ISOLATED AMPLIFYING GATE THYRISTOR WITH CONTROLLABLE DV/DT COMPENSATION, HIGH DI/DT CAPABILITY, AND HIGH SENSITIVITY

[75] Inventor: Victor A. K. Temple, Jonesville, N.Y.

[73] Assignee: General Electric Company, Schenectady, N.Y.

[21] Appl. No.: 152,772

[22] Filed: May 23, 1980

[51] Int. Cl.³ ............................................. H01L 29/74
[52] U.S. Cl. ........................................ 357/38; 357/51; 357/55; 357/86
[58] Field of Search ........................ 357/38, 55, 86, 51

[56] References Cited

U.S. PATENT DOCUMENTS

| | | | |
|---|---|---|---|
| 3,794,890 | 2/1974 | Weimann et al. | 357/38 |
| 3,967,294 | 6/1976 | Takase et al. | 357/38 |
| 4,110,638 | 8/1978 | Voss | 357/38 |
| 4,208,669 | 6/1980 | Silber et al. | 357/38 |

FOREIGN PATENT DOCUMENTS 2610828  10/1976  Fed. Rep. of Germany ............. 357/38

OTHER PUBLICATIONS

Silber et al., "Improved Gate Concept for Light Activated Power Thyristors," IEEE Int'l. Dev. Meeting, 1975, #16.4, pp. 371–374.

Primary Examiner—Joseph E. Clawson, Jr.
Attorney, Agent, or Firm—Nathan D. Herkamp; James C. Davis, Jr.; Paul R. Webb, II

[57] ABSTRACT

A semiconductor device used for high voltage applications is disclosed. The disclosed semiconductor device is an amplifying gate thyristor having a gate region, a pilot thyristor, a main thyristor and a compensation region. The compensation region in conjunction with a circuit arrangement and contact regions disposed on the amplifying gate thyristor, supplies a bias voltage developed by dv/dt currents flowing within the compensation region that is of equal potential to a voltage developed within the gate region by the dv/dt currents flowing within the gate region. The circuit arrangement, in conjunction with the contact regions, improves the dv/dt capability of the pilot thyristor without causing subsequent degradation of the dv/dt capability of the main thyristor. The circuit may be further arranged to provide an improvement to the dv/dt capability of the main thyristor. Similarly, the contact regions may be further arranged to provide an improvement to the di/dt capability of the pilot thyristor of the device. The various disclosed embodiments also provide for further improvements to the gate sensitivity of the amplifying gate thyristor.

5 Claims, 9 Drawing Figures

PARTIALLY ISOLATED AMPLIFYING GATE THYRISTOR WITH CONTROLLABLE DV/DT COMPENSATION, HIGH DI/DT CAPABILITY, AND HIGH SENSITIVITY

BACKGROUND OF THE INVENTION

This invention relates to semiconductor devices, and more particularly, to high voltage semiconductor devices such as amplifying gate thyristors that are concerned with improved dv/dt capability and other characteristics of the device.

Thyristors, triacs and transistors are semiconductor devices which are often used to turn-on and/or turn-off high voltage circuits. One form of a thyristor is an amplifying gate thyristor. The amplifying gate thyristor has a gate region, a pilot thyristor stage and a main thyristor stage. The pilot thyristor stage supplies amplification of the current applied to the gate region in order to more quickly and completely turn on the main thyristor stage of the amplifying gate device. A main voltage is applied across a cathode electrode and an anode electrode such that a main current flows therebetween upon application of a control signal to the gate region of the amplifying gate thyristor. The amplifying gate thyristor is said to be in a turned-on state when a conduction current flows between the cathode electrode and the anode electrode.

One characteristic of amplifying gate thyristors, commonly termed the dv/dt capability of the device, manifests the ability of the semiconductor device to withstand the rate of change at which the voltage across the cathode and the anode electrodes is applied without turning on, and is measured in volts/per microsecond. A high rate of change of applied cathode to anode voltage creates relatively large capacitive charging currents within the amplifying gate thyristor and elsewhere, which may be manifested as a gate current to the pilot or main thyristor at a sufficient level to inadvertently turn-on the high voltage device.

The dv/dt capability of the device may be improved by various bias techniques which involve supply, from an external source, of various bias voltages to the amplifying gate thyristors. The externally supplied bias voltages increase the level of dv/dt capacitive charging currents required to inadvertently turn-on the amplifying gate thyristor.

It is also known that the dv/dt capability may be improved by an internal arrangement of an amplifying gate thyristor. One such arrangement is described in a technical paper by D. Silber and M. Fullman, entitled "IMPROVED GATE CONCEPT FOR LIGHT ACTIVATED POWER THYRISTORS", published in the International Electron Devices Meeting, 1975, Washington D.C., on pages 371-374. The published report describes an arrangement having a dv/dt compensating ring in which capacitive charging currents flowing within the device near the edge surface of an optically fired amplifying gate thyristor are used to compensate for the capacitive charging currents flowing in the gate region of the amplifying gate thyristor. These compensating currents flowing within the edge of of the device reduce the forward biasing of the pilot stage emitter normally caused by the capacitive charging currents conducted to the pilot thyristor. However, the edge flowing compensating currents and the currents flowing within the gate region become additive as they are conducted to the main thyristor stage and thereby reduce or degrade the dv/dt capability of the main thyristor stage. Also, should a negative dv/dt transition occur, which is normally generated at the termination of the positive anode-cathode voltage, the edge compensation currents tend to turn on the pilot thyristor stage.

The present invention relates to a circuit arrangement used in conjunction with a plurality of annular rings disposed on an amplifying gate thyristor. The invention without degrading the dv/dt capability of the main thyristor stage. The invention further provides for an improved dv/dt capability of the main thyristor of the amplifying gate thyristor.

One object of the present invention is to provide capacitive charging currents within an amplifying gate thyristor as compensation currents to increase dv/dt capability of the pilot thyristor without degrading the dv/dt capability of the main thyristor.

Another object of the present invention is to provide improved dv/dt capability of the main thyristor in an amplifying gate thyristor.

A further object of the present invention is to provide an amplifying gate thyristor having improved gate sensitivity and di/dt capability.

A still further object of the present invention is to provide an amplifying gate thyristor having means for trimming or tuning the sensitivity of the device and also means for trimming or tuning the dv/dt capability of the device.

These and other objects of the present invention will become apparent to those skilled in the art upon consideration of the following description of the invention.

SUMMARY OF THE INVENTION

The present invention is directed to increasing the capabilities of an amplifying gate thyristor by the use of capacitive charging current flowing within a compensation region of the device.

In accordance with one preferred embodiment of the invention, an amplifying gate thyristor has a gate region, a pilot thyristor stage, a main thyristor stage and an anode. Each of the pilot thyristor stage and the main thyristor stage includes an electrode and an emitter layer affixed to the electrode thereunder, respectively. The electrode of the main thyristor stage together with the emitter layer thereunder, forms the cathode of the amplifying gate thyristor. The cathode and the anode are adapted to be coupled to a relatively high voltage source capable of creating capacitive charging currents, commonly denoted as dv/dt current, which may be manifested as a gate current to the pilot thyristor and the main thyristor at a sufficient value to render either thyristor conductive, and thereby render the amplifying gate thyristor conductive. The amplifying gate thyristor further comprises a plurality of contact regions disposed on a top surface thereof, a first isolation means, a first impedance means, a second impedance means, and a compensation region. The plurality of contact regions includes a first contact region located in the gate region and radially inward of the first isolation means, a second contact region located to contact a p-base layer on the main thyristor stage and which comprises the gate electrode of the main thyristor stage, and a third contact region located between the electrode of the pilot thyristor stage and the second contact region. The third contact region is coupled to the electrode of the pilot thyristor by a conductive element and is separated from the electrode of the pilot thyristor and the first contact region by the first isolation means.

The first isolation means is located on the top surface of the device and is comprised of a relatively high impedance to provide a relatively high lateral impedance for carriers in the cathode base layer to isolate the second contact region from the emitter layer of the pilot thyristor stage and the first contact region. The impedance of the first isolation means has a predetermined value substantially greater than the sum of the impedance of the second impedance means and the impedance between the second contact region and the cathode of the main thyristor. The region from the centerline to the central portion of the first isolation means comprises a central region which includes the gate region and the pilot thyristor region of the amplifying gate thyristor. The first impedance means includes a second isolation means and a first resistive element. The second isolation means is situated on the top surface of the amplifying gate thyristor and is comprised of a relative high impedance to provide a relatively high lateral impedance for carriers in the cathode base layer to isolate the second contact region from the third contact region. The resistive portion of the first impedance means is at a predetermined impedance value coupled between the second and third contact regions. The second impedance means is of a predetermined impedance value, and is coupled between the first contact region and the cathode. A compensation region is comprised of the region between the center of the first isolation means and the center of the second isolation means and collects a certain amount of charging current proportional to its area. The arrangement of the plurality of the contact regions, the first and second isolation means, the first resistive element, the impedance of the second impedance means, and the capacitive charging currents flowing within the compensation and central regions, causes establishment of a voltage on each of the second and third contact regions. The voltage on the third contact region is the sum of the voltage drop across the first resistive element, which is proportional to the capacitive charging currents flowing within the compensation region (given by the area of the compensation region times the dv/dt times the inherent capacitance of the compensation region) times the impedance value of the first resistive element, plus a relatively small voltage drop between the second contact region and the cathode. The voltage on the first contact region is the voltage drop across the second impedance means and is proportional to the capacitive charging currents flowing within the central region (given by the area of the central region times the dv/dt times the inherent capacitance of the central region) times the impedance value of the second impedance means. Selection of impedance value of the first resistive element, the impedance value of the second impedance means, the area of the central region and the area of the compensation region provides for the first and second voltages that are substantially equal, under both positive and negative dv/dt conditions, thereby improving the dv/dt capability of the pilot thyristor. Further, by diverting central region dv/dt current through the second impedance means, the dv/dt capability of the main thyristor of the amplifying gate thyristor is also improved.

The features of the invention believed to be novel are set forth with particularly in the appended claims. The invention, itself, however, both as to its organization and method of operation, together with further objects and advantages thereof, may be best understood by reference to the following description taken in conjunction with the accompanying drawings.

DETAILED DESCRIPTION OF THE PREFERRED EMBODIMENT

Figure 1:
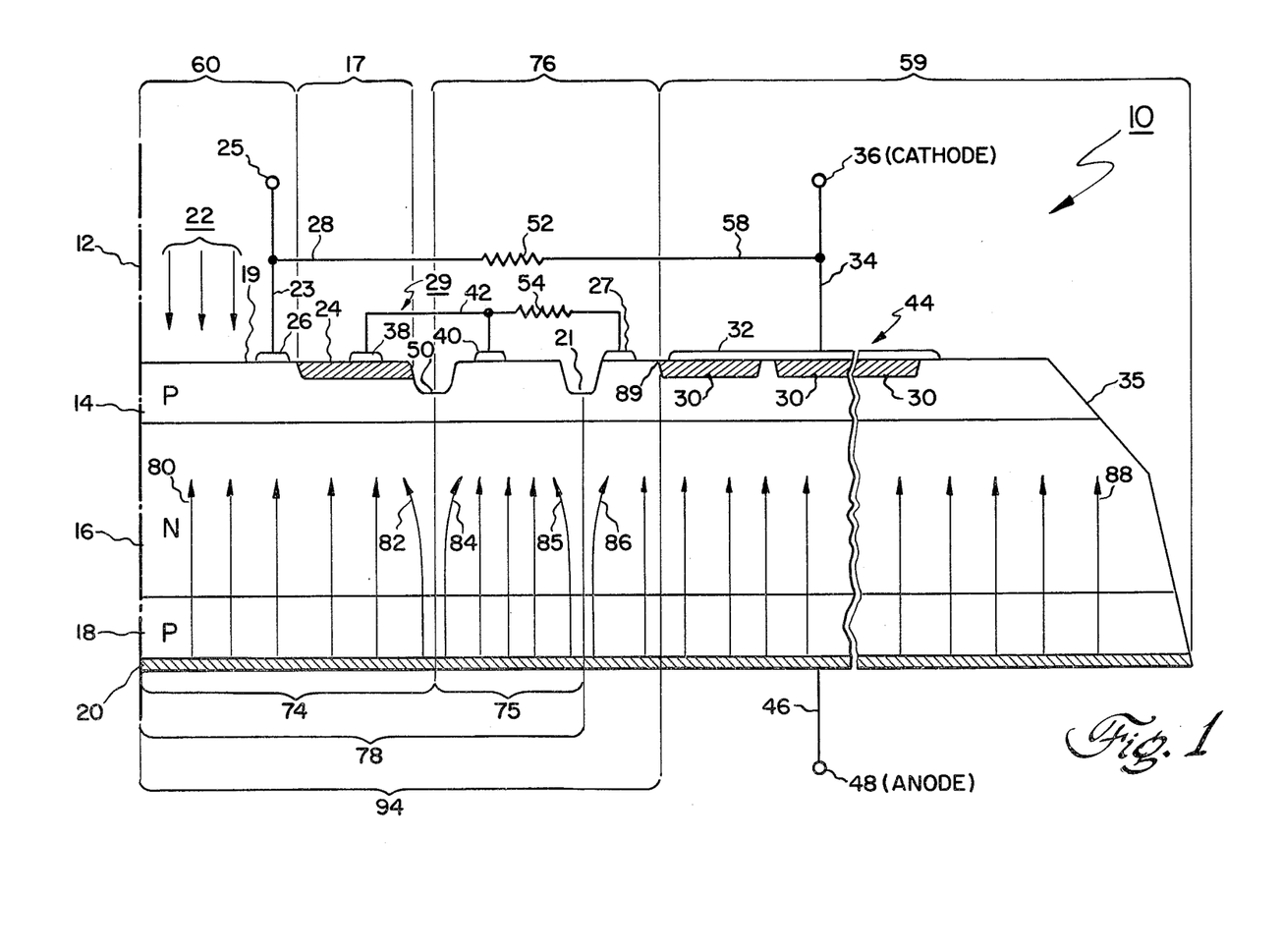
FIG. 1 shows a partial cross section of an amplifying gate thyristor in accordance with one embodiment of the present invention.

FIG. 1 shows a partial cross section of an amplifying gate thyristor 10 exemplifying one embodiment of a semiconductor device of the present invention. Device 10 has an anode base layer 16 of an n-type semiconductor material and p-type semiconductor material forming layer 18 which is situated beneath and in contact with layer 16. A cathode-base layer 14 of p-type semiconductor material is situated above and in contact with the layer 16. Situated on the outer periphery of layers 14 and 16 is a beveled surface 35. Beveled surface 35 is provided for the purpose of increasing the avalanche breakdown voltage. Semiconductor layer 14 forms a major portion of a top surface 19 of the semiconductor device 10. Semiconductor layer 16 normally forms the substrate of the device 10 into which other layers are diffused.

Device 10 has a pilot thyristor stage 29 and a main thyristor stage 44 each having a high conductivity n+ semiconductor material shown respectively as 24 and 30. The n+ conductivity material 24 forms an emitter of the pilot thyristor 29. Similarly, the n+ conductivity material 30 forms an emitter of the main thyristor 44. Portions of n+ conductivity material 24 and 30 forming the emitters of thyristors 29 and 44 respectively, are overlayed respectively with metallization layers 38 and 32. It is important that metallization layer 38 not short layer 24 to layer 14. Metallization layer 32 provides the means for connecting one end of a relatively high voltage source, via a conductor 34 and a terminal 36, to the main thyristor 44. The metallization layer 32 together with emitter 30 is herein termed the cathode of device 10. A metallization layer 20 which is positioned under layer 18 provides the means for connecting the other end of the high voltage source to device 10 via a conductor 46 and a terminal 48. Metallization layer 20 is herein termed the anode of the device.

Device 10 has a gate region 60 extending from the centerline 12 of the device 10 to the inner periphery of pilot emitter region 24. In one form of a photo-sensitive amplifying gate thyristor 10, radiation from a light emitting source 32 may impinge upon the top surface 19 within a part or all of the gate region 60. In another form of the amplifying gate thyristor 10, an electrical signal functioning as a gate signal may be connected to the gate electrode 26 via a conductor 23 and terminal 25.

Device 10 has a pilot thyristor region 17 coincident with pilot emitter region 24 as shown in FIG. 1. Device 10 also has a region 59 extending from a turn-on line 89 of the main thyristor 44 to the outer edge of device 10 as shown in FIG. 1. Device 10 has a further region 94 extending from a centerline 12 to turn-on line 89. Device 10 has a further region 76 situated between a central portion of a first isolation means 50 and the turn-on line 89 of main thyristor 44. Located within the region 76 are the second contact region 27 and a third contact region 40 which are positioned on the top surface 19 of the device 10. The second contact region 27 is located in an area adjacent to the electrode 32 of the main thyristor 44. The third contact region 40 is positioned adjacent to the isolation region 50. The first contact region 26 is positioned on the top surface 19 of the device 10 and is located adjacent to the pilot thyristor region 17 as shown in FIG. 1. Contact region 26, 27 and 40 each have a metallization layer having a suitable thickness usually in the order of 2 to 20 microns. The metallization layers for contact regions 26, 27 and 28 have an annular ring shape shown most clearly in FIG. 5.

The invention has various embodiments related to the structure and interconnections of the first impedance means 54 [or 55] and a second impedance means 52 [or 57]. In one such embodiment, a first impedance 54 may be externally interconnected, as shown in FIG. 1, between the second contact region 27 and the third contact region 40. In another embodiment a first impedance means 55, shown in FIG. 3, may be internally added into device 10 by appropriate etching techniques, which form a groove in the top layer 19 of device 10 situated between the second and third contact regions 27 and 40 respectively, and is most effective if situated adjacent to the second contact region 27. The length, width, and depth of the groove controls the impedance value of the impedance means 55. An isolation means 21 having a predetermined impedance and internally formed in top layer 19 between the third and second contact regions 40 and 27, respectively, by appropriate etching techniques is used in conjunction with the external first impedance means 54 and is most effectively positioned adjacent to the second contact region 27, as shown in FIG. 1.

Figure 1A:
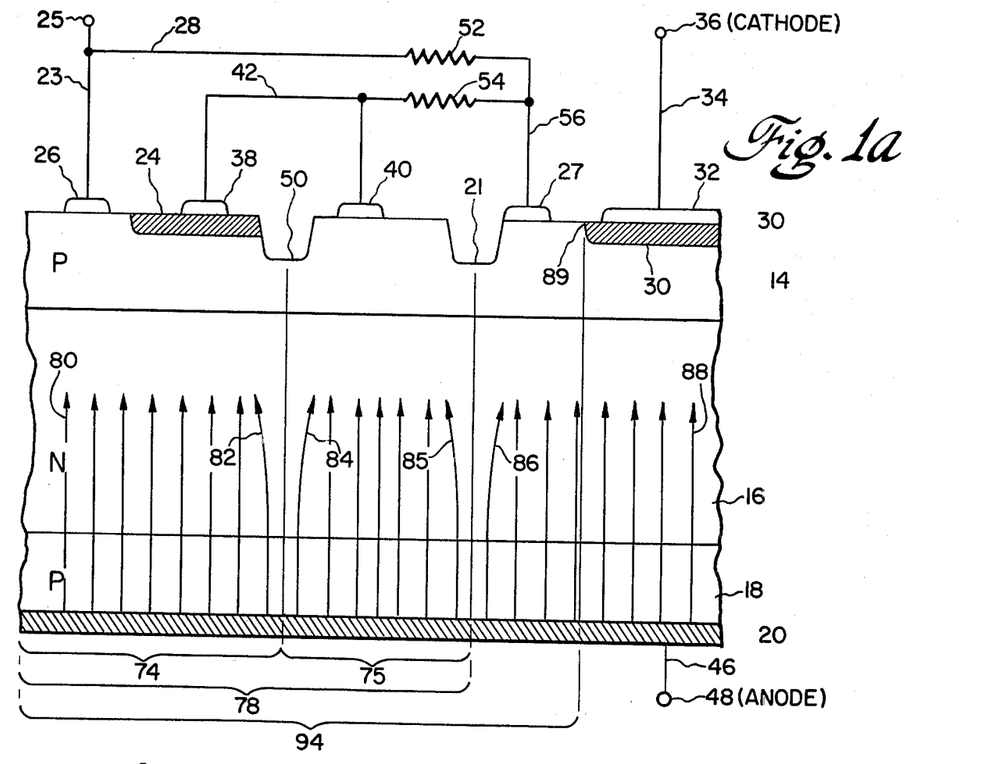
FIG. 1a shows a modified version of a portion of the apparatus shown in FIG. 1.

With regard to the second impedance means 52 [or 57], a first embodiment may have the second impedance means 52 externally connected, as shown in FIG. 1, between the first contact region 26, via conductor 28, and the cathode electrode 32 of the main thyristor 44 via a conductor 58. In another embodiment, as indicated in FIG. 1a, the second impedance 52 may be externally interconnected between the first contact region 26, via the conductor 28, and the second contact region 27 via a conductor 56.

Figure 5:
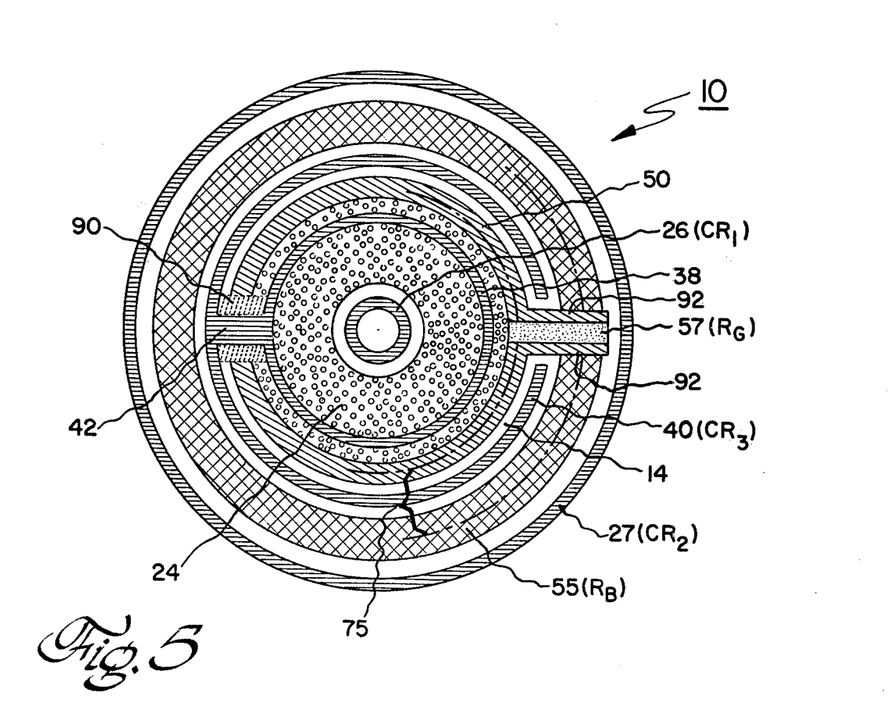
FIG. 5 is a top view of an amplifying gate structure with integrated first and second impedance means.

In FIG. 1, in a manner similar to the first impedance means 55, a second impedance means 57 may be internally interconnected between the first contact region 26 and the electrode 32 or between the first and second contact regions 26 and 27, respectively, by appropriate etching techniques forming a resistive channel lying between outward projections of the first isolation region 50 through the compensation region between the desired locations. The internally formed impedance means 57 connected between the first and second contact regions 26 and 27, respectively, is shown in FIG. 5. Each of the hereinbefore described impedance means 52, 54, 55 and 57 have a predetermined impedance value. Impedance values 52 and 54, however, being external resistances, may be easily adjusted to establish required voltages under dv/dt conditions, as discussed hereinafter.

An isolation means 50 is provided by appropriate etching techniques, forming a groove in the top surface 19 of device 10 situated between the electrode 38 of the pilot thyristor 29 and the third contact region 40. Electrode 38 and contact region 40 are connected together by an external conductor 42. Isolation means 50 provides a predetermined minimum lateral impedance between electrode 38 and contact region 40. The location of a central portion of isolation means 50 is shown in FIG. 1 as a distance 74 extending from the centerline 12 of device 10. The region of device 10 extending from centerline 12 to distance 74 will hereinafter be referred to as the first region 74. Similarly, the location of a central portion of isolation means 21 is shown in FIG. 1 as a distance 78 extending from centerline 12. The spacing between distances 78 and 74 is shown as a distance 75 and that spacing will hereinafter be referred to as compensation region 75.

As previously discussed, relatively high voltage impressed across the cathode and the anode of a semiconductor device, such as device 10, may cause capacitive charging currents, commonly termed dv/dt currents, to flow within device 10. The dv/dt currents as shown in FIG. 1 by a plurality of arrows 80, 82, 84, 85, 86, and 88, for illustrative purposes, as initiating from anode 20 and continuing into layers 18 and 16. However, it should be recognized that these dv/dt currents may flow within device 10 from the anode 20 to the top surface 19. Also, arrows 82 and 85 and 84 and 86, are shown, for illustrative purposes, as bending to the left and to the right, respectively, about distances 74 and 78, respectively, which are the approximate mid-points of isolation means 50 and 21 respectively. The mid-points of isolation means 50 and 21 are effectively division points in which the dv/dt currents 82 and 84, and 85 and 86, intercepting isolation means 50 and 21, respectively, are divided into two portions. One portion of the divided dv/dt current 82 and 84 is diverted towards the first contact region 26 while the second portion of the divided dv/dt currents 82 and 84 is diverted toward the third contact region 40. Similarly, one portion of the divided dv/dt currents 85 and 86 is diverted toward the third contact region 40 while the second portion of the divided dv/dt currents 85 and 86 is diverted toward the second contact region 27. The portion of the dv/dt currents flowing within compensation region 75, as will be explained hereinafter, constitutes a compensation current to improve the dv/dt capability of device 10. In order to more fully appreciate the inventive concepts of this invention, discussion will be first directed to a prior art device 110, shown in FIG. 6, in which internally developed compensation currents are also employed.

Figure 6:
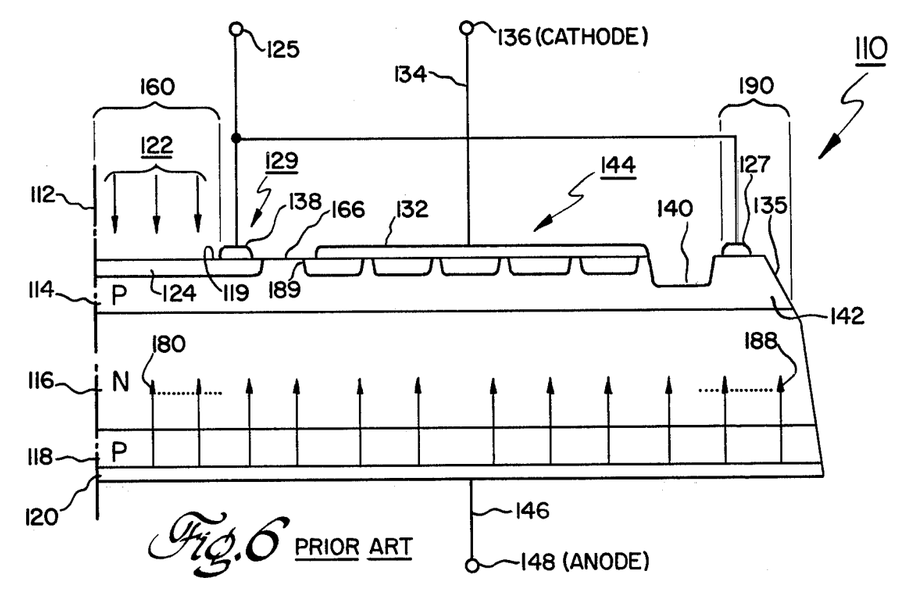
FIG. 6 is a partial cross section of a prior art amplifying gate thyristor.

FIG. 6 shows a partial cross section of an amplifying gate thyristor 110. Elements 112, 114, 116, 118, 120, 122, 124, 126, 129, 130, 132, 134, 135, 136, 138, 146, 148, 160, 180, 188 and 189 of device 110, shown in FIG. 6, are similar to the previously described elements 12, 14, 16, 18, 20, 22, 24, 25, 29, 30, 32, 34, 35, 36, 38, 46, 48, 60 80, 88 and 89, respectively, of device 10 shown in FIG. 1.

A contact region 127 is positioned near the outer periphery of device 110 adjacent the beveled surface 135 and situated on the top portion 119 of device 110. The contact region 127 is separated from the electrode 132 of a main thyristor 144 by an isolation means 140, similar to isolation means 50 formed in the top surface 119 of device 110 by appropriate etching techniques. Isolation means 140 provides a relatively high lateral impedance between the electrode 132 and the contact region 127. Contact region 127 located on the top portion 119 of the device 110 is in proximity to a region 190 located near the edge of device 110. Contact region 127 is connected to the electrode 138 of a pilot thyristor 129 via a conductor 128. An approximate equivalent electrical circuit of the amplifying gate thyristor 110 is illustrated in FIG. 7.

Figure 7:
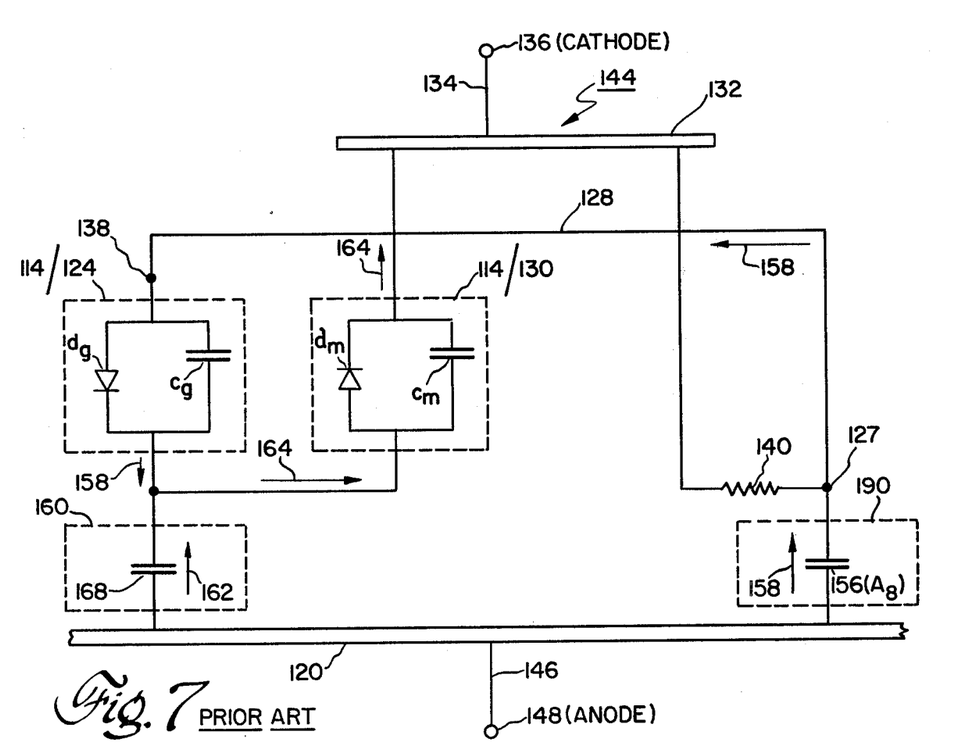
FIG. 7 is an approximate equivalent circuit of the amplifying gate thyristor shown in FIG. 6 suitable for determining turn-on thresholds.

The dv/dt currents flowing within the edge region 190 are representatively shown in FIG. 7 by an arrow 158. The capacitance within region 190 is represented by a capacitor 156($A_8$). The dv/dt currents 158 flowing toward the top surface 119 encounter two impedance paths; (1) a relatively high impedance path presented by isolation means 140 and (2) an extremely low impedance path presented by contact region 127 having connected to it a conductor 128. The path presented by the contact region 127 and conductor 128 diverts substantially all of the dv/dt currents 158 to the electrode 138 of pilot thyristor 129. The dv/dt currents 158 are conducted to the n+conductivity material 124 of the pilot thyristor 129 via electrode 138. The emitter junction between the semiconductive materials 114 and 124 of the pilot thyristor 129 is represented in FIG. 7 as a parallel arrangement 114/124 of a diode $d_g$, and an inherent junction capacitance $c_g$. Similarly, the emitter junction between the semiconductive materials 114 and 130 of the main thyristor 144 is represented by a parallel arrangement 114/144 of a diode $d_m$ and an inherent junction capacitance $c_m$. The dv/dt currents flowing within the gate region 160 of device 110 is shown as an arrow 162 and the inherent capacitance of region 160 is represented by a capacitor 168.

The dv/dt currents 158 of the edge region 190 flowing through conductive material 124 oppose the dv/dt currents 162 of the gate region 160. The opposition between the dv/dt currents 158 and 162 results in an arrangement in which the dv/dt current required to render pilot thyristor 129 conductive is increased, which correspondingly increases the dv/dt rating of the pilot thyristor 129. However, the portions of currents 158 and 162 conducted towards the conductive material 130 of the main thyristor 144 become additive. The additive portions of the dv/dt currents 158 and 162 are shown as arrow 164. The additive current 164 correspondingly degrades the dv/dt capability of the main thyristor 144. Also, due to a substantial imbalance in area between the gate region 160 and the outer region 190 of the device 110, the pilot thyristor stage 129 may be more susceptible to a negative dv/dt transient. For example, even if the pilot thyristor stage 129 withstands a voltage rise in the order of 2000 V within a 1 microsecond period, assuming the additive currents 164 do not turn-on the main thyristor 144, a negative decay of the voltage transient in the order of 2000 V to 100 V in 0.95 microseconds, may result in a turned-on pilot stage 129 due to the larger area 190 supplying a dv/dt current to the pilot stage emitter 124 which is of a sufficient level to forward-bias the pilot thyristor 129 and thus turn it on. In essence, the use of a large region, such 190, to supply a compensation current to a smaller region, such as 160, may result in a device 110 that has a dv/dt capability substantially degraded with respect to a negative dv/dt current.

The structure of the amplifying gate thyristor 10 of FIG. 1 provides internal compensating dv/dt currents for the pilot thyristor 29 that does not degrade but rather improves the dv/dt capability of the main thyristor 44, and does not degrade the dv/dt capability of the pilot thyristor 29 with regard to negative dv/dt currents.

Figure 2:
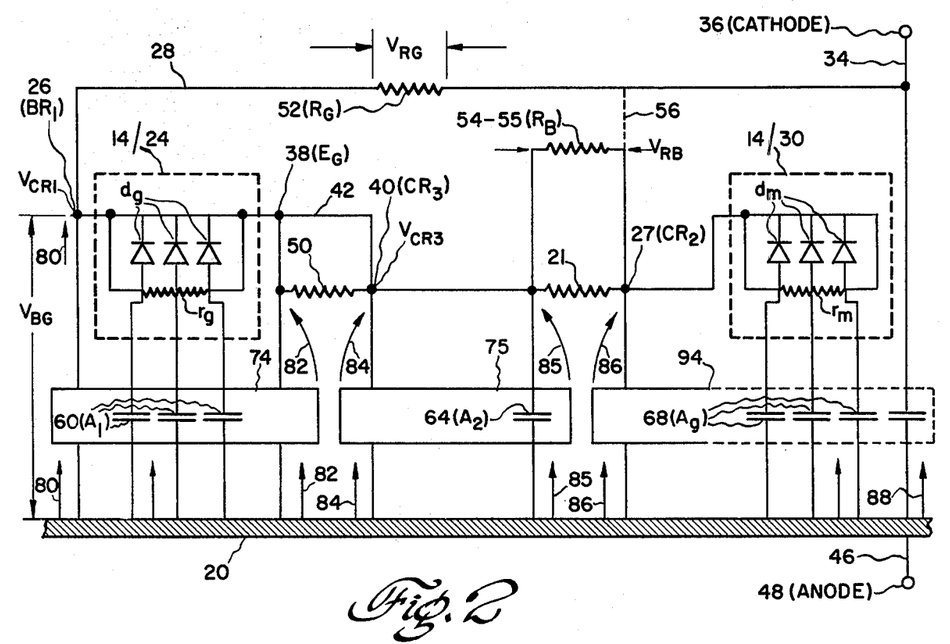
FIG. 2 shows an approximate electrical equivalent circuit of the amplifying gate thyristor shown in FIG. 1 suitable for determining turn-on thresholds.

As previously discussed, the structure of device 10 may be arranged according to several embodiments. A preferred embodiment has the first impedance means 54 externally connected between contact regions 27 and 40, an isolation means 21 internally formed between contact regions 27 and 40, and the second impedance means 52 externally connected between the first contact region 26 and the electrode 32 of the main thyristor 44. Reference is now made to FIG. 2 showing an approximate electrical equivalent circuit of this preferred embodiment.

The inherent capacitance of region 74 is shown as a capacitor 60 with area $A_1$. Similarly, the inherent capacitance of the compensation region 75 is shown as a capacitor 64 with area $A_2$ and the inherent capacitance of region 94 is shown as a capacitor 68 with area $A_g$. The emitter junction between conductive materials 14 and 24 of the pilot thyristor 29 is shown as a parallel arrangement 14/24 of diodes $d_g$, with underlying base layer 14 resistance $r_g$. Similarly, the emitter junction between the conductive materials 14 and 30 of the main thyristor 44 is shown as a parallel arrangement 14/30 of diodes $d_m$, with the underlying base layer 14 resistance $r_m$. The contact regions 26, 40 and 27, are shown in FIG. 2 as 26 ($CR_1$), 40 ($CR_3$), and 27 ($CR_2$), respectively. The first impedance means 54, or alternatively the first impedance means 55, is shown in FIG. 2 as 54–55 ($R_B$). The second impedance means 52 is shown as 52 ($R_G$). The second impedance 57 is not shown in FIG. 2 for purposes of clarity, but it should be recognized that the second impedance means 57 serves the same function as the second impedance means 52. The usage of symbols in conjunction with reference numbers is for purposes of clarity which will become apparent hereinafter in the discussion of equations (1)–(6). The voltage drop across impedance means 52 or $R_G$ is $V_{RG}$. The voltage drop across impedance means 54 or $R_B$ is $V_{RB}$. $V_{CR1}$, $V_{CR2}$ and $V_{CR3}$ are the voltages of CR1, CR2 and CR3, respectively.

The circuit arrangement, approximately modeled in FIG. 2, utilizes the dv/dt currents flowing in regions 74 and 75 to establish the voltages of CR1 and CR3 at substantially the same value. In order to achieve relatively high dv/dt ratings, it is necessary only to insure that voltage difference ($V_{CR1}-V_{CR3}$) does not become greater than a threshold voltage for pilot thyristor stage 29 usually in the range of 0.5 to 0.8 volts for silicon devices, i.e. just a bit larger than ½ the band gap voltage. In order to provide a desired flow of dv/dt current within device 10, the impedance value of isolation means 50 is chosen to have a value $R_I$ that is much greater than $R_G$ plus the impedance between 14 and 30 approximately identical to $r_m$. Isolation means 50 will therefore have a minimum value in the range of 1k to 10k. Similarly, isolation means 21 will have a minimum value in the range of 1k to 10k.

The voltage difference $V_{CR1} - V_{CR3}$ may be represented by the following relationship $$V_{CR1} - V_{CR3} = J(A_1 R_G - A_2 (R_B + r_m)) \quad (1)$$

wherein
 $J = C_J \, dv/dt$
 $A_4$ = area of region 74,
 $A_2$ = area of region 75,
 $R_G$ = resistance value of the impedance means 52
 $R_B$ = resistance value of the impedance means 54 or 55
 $r_m$ = inherent base resistance of layer 14 between CR2 and the cathode 32, and;
 $C_J$ = is the $P_{base}-n_{base}$ capacitance per unit area of the regions 74 and 75

For the alternative embodiment of the invention, shown in FIG. 1a in which the impedance means 52 is connected to the second contact region 27, the voltage difference $V_{CR1} - V_{CR3}$ may be represented by the following relationship:

$$V_{CR1} - V_{CR3} = J(A_1 R_G - A_2 R_B) \quad (2)$$

wherein the symbols used are the same as described for equation (1).

Figure 3:
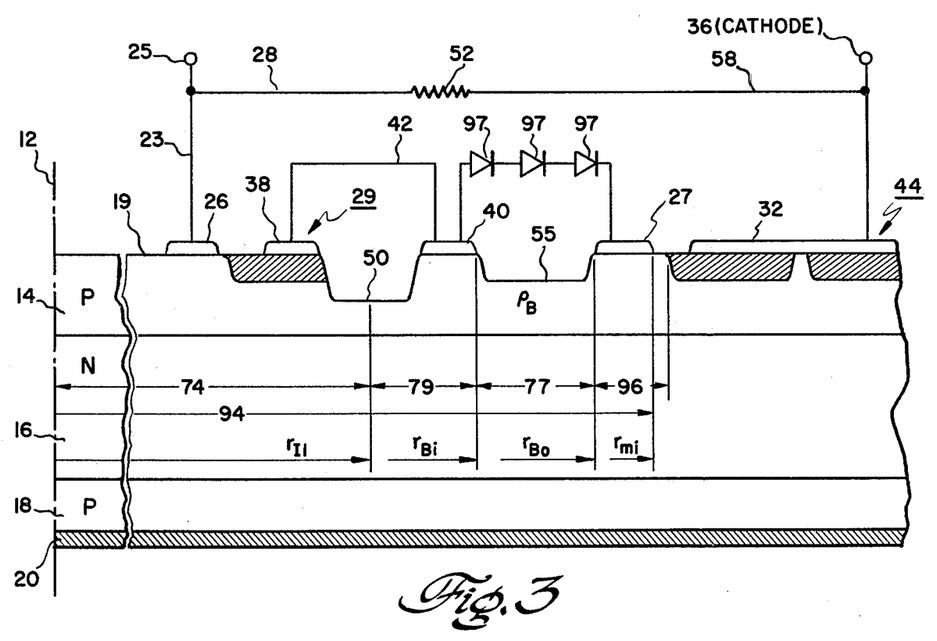
FIG. 3 shows an alternate embodiment of the present invention including a desirable diode string.

In the alternative embodiment of the invention shown in FIG. 3, in which the first impedance means 55 is a groove etched into top layer 19, and in which isolation means 21 of the embodiment shown in FIG. 1 is not used, the relationship of $V_{CR1} - V_{CR3}$ becomes more complex than equations (1) and (2). Reference is now made to FIG. 3 for a more detailed description of the embodiment having the etched first impedance means 55.

Figure 3A:
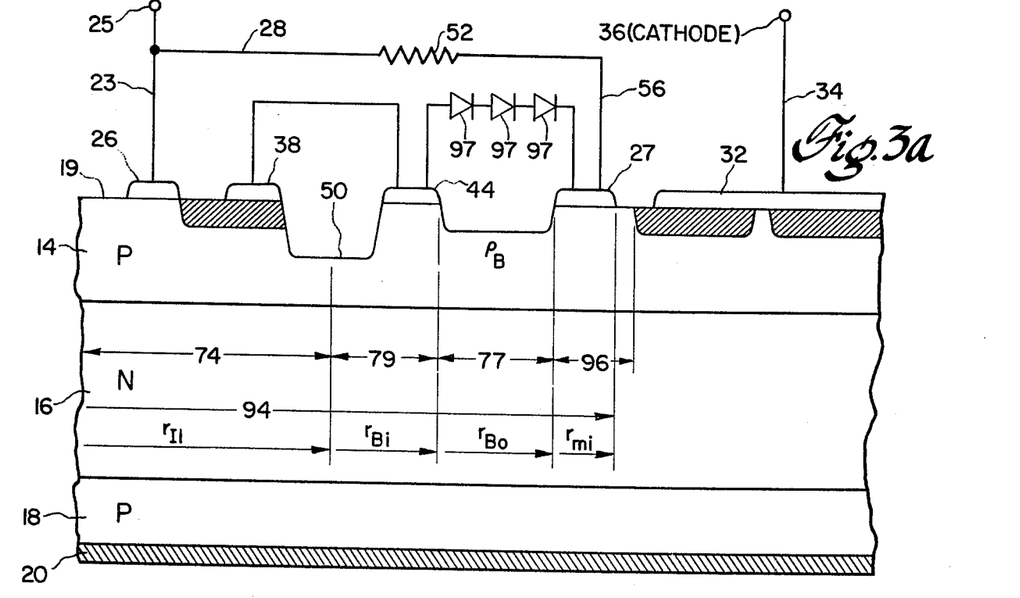
FIG. 3a shows a modified version of a portion of the apparatus shown in FIG. 3.

The impedance means 55 is shown as a groove etched into layer 19 and having a resistivity $\rho_B$ measured in ohms per square. Impedance means 55 is further shown within a region 77 having an inner radius of $r_{Bi}$ and an outer radius of $r_{Bo}$, both referenced to centerline 12. Similarly, isolation means 50 is shown as located partially within a subregion 79 having an inner radius $r_{I1}$ and an outer radius $r_{Bi}$, both radii referenced to centerline 12. The main thyristor 44 exhibits a resistance $r_m$ which begins at distance 94 from centerline 12 and extends outward to the edge of device 10. Further, the first impedance 52 may have one side connected to cathode electrode 32 via conductor 58, or it may have one side of first impedance means 52 connected to contact region 27 via conductor 56, as shown in FIG. 3a, instead of to cathode electrode 32.

The voltages $V_{CR3}$ and $V_{CR1}$ for the embodiment shown in FIG. 3 having impedance means 52 connected to contact region 27 may be represented by the following relationship:

$$V_{CR3} = \pi(r_{B1}^2 - r_{I1}^2)\frac{1}{2\pi} \rho_B l_n\left(\frac{r_{Bo}}{r_{Bi}}\right) \cdot J + \frac{\rho_B}{2} J \int_{r_{Bi}}^{r_{Bo}} \frac{(r^2 - r_{Bi}^2)}{r} dr + V_{CR2} \quad (3)$$

$$V_{CR1} = J A_1 R_G + V_{CR2} \quad (4)$$

wherein: $r$ = variable radius referenced from the centerline 12.

The voltage difference $V_{CR1} - V_{CR3}$ related to equations (3) and (4) determines whether the device 10 is to be turned on or remain off for a given current density J.

The voltage $V_{CR3}$ for the embodiment shown in FIG. 3 having impedance means 52 connected to electrode 32 is completed by defining $V_{CR2}$ by the following relationship:

$$V_{CR2} = \pi J (r_{m}^2 - r_{I1}^2) r_m \quad (5)$$

The voltage difference $V_{CR1} - V_{CR3}$ related to equation (5) is given by the following relationship:

$$V_{CR1} - V_{CR2} = J((A_1 R_G) - \text{equation (3)}) \quad (6)$$

with equation (5) substituted for $V_{CR2}$.

Review of Equations (1)–(6) reveals that there are four variables that can be altered to have the value of $V_{CR1} - V_{CE3} = 0$, regardless of dv/dt values. These four variables are (1) $R_G$, (2) the area of region 74, (3) $R_B$, and (4) the area of compensation region 75. It should be further noted from review of FIG. 2, that the voltage potential at the junction of n+ semiconductor material 24 of pilot thyristor 29 and base layer 14 is the voltage difference $V_{CR1} - V_{CR3}$. It should be still further noted from review of FIG. 2, that the circuit arrangement having impedance means 52 connected to cathode electrode 32 diverts and reduces a portion of the dv/dt current that would normally be conducted to the turn-on line 89 of the main thyristor 44. Thus, it should be appreciated that the invention provides a substantial improvement to the dv/dt capability of the pilot thyristor 29 but also provides some improvement to the dv/dt capability of the main thyristor 44. Should more improvements to the main thyristor be desired, standard methods may be used, such as higher emitter short density and emitter shorts closer to the turn-on line 89. Note that because this is an amplifying gate thyristor, device sensitivity to normal gating will not be reduced since this is controlled sensitivity of the pilot stage which is largely controlled by $R_G$.

With further regard to FIG. 1, it should be noted that a substantial improvement to the dv/dt capability of the main thyristor may be established by the connection of the impedance means 52 to the electrode 32 of the main thyristor. Connection of the impedance means 52 to electrode 32, via the conductor 58 further improves the dv/dt rating of the main thyristor 44 by providing a shunt path for the dv/dt currents flowing within the region 74 such that a portion of the dv/dt current flowing within region 74 is diverted away from the turn-on line 89 of the main thyristor 44.

The circuit arrangement shown in FIG. 2 further provides the following advantages for the amplifying gate thyristor 10; (1) high sensitivity due to use a relatively large impedance value for $R_G$, (2) the ability to use and yet retain dv/dt capability of a large gate region 60, (3) the means for tuning or trimming the gate sensitivity by varying $R_G$, (4) the means for tuning or trimming the dv/dt capability of the pilot thyristor 29 by varying $R_B$ and (5) improved dv/dt capability of the main thyristor 44 when $R_G$ is connected directly to the cathode 32.

The usage of a relatively large value of $R_G$ results in a desirable large gate voltage potential $V_{CR1} - V_{CR3}$ for small normal gate currents such that upon application of a gate signal to terminal 25 and thus electrode 38, the pilot thyristor 29 may respond more quickly at lower gate current as compared to a pilot thyristor not having the relatively large $R_G$ arrangement. Note that in normal gating $V_{CR3}$ is approximately equal to zero as no current is flowing in the compensation region 75. Similarly, for a light sensitive device 10, $R_G$ allows for a relatively low level of light illumination 22 to be utilized and still allow device 10 to turn-on.

The usage of the circuit arrangement shown in FIG. 2, in particular a large $R_B$ and a large $R_G$, also allows for an increase in the gate region area 60, thus leading to higher di/dt capability of the amplifying gate thyristor 10 while maintaining the desired dv/dt capability of the device. The increase in the area of gate region 60 is of particular advantage for an amplifying gate thyristor 10 having a gate region sensitive to light. An increase of photosensitive area allows for simpler coupling means and simpler packages. When light source 22 is shone on device 10, the light collected interior to the area defined by the distance 74 from centerline 12 helps to turn on the pilot thyristor 29 while the light collected external to the area defined by distance 74 hinders its turn-on by raising $V_{CR3}$. If the relatively large photosensitive gate area is used for the pilot thyristor region, and a constant photo density light source 22 is shone on the device 10, and further if the area external to the distance 74 is shadowed, then both $R_G$ and gate region area 60 may be varied to effect the light density threshold required for turn-on.

Another turn-on consideration related to the di/dt capability of an amplifying gate device 10 is the total area of the pilot thyristor emitter. If the gate region 60 area is increased, it would result in a device 10 with an improved di/dt capability, provided turn-on is uniform over its entire area, and a proportionately larger peak current capability. Such an improvement is shown in FIG. 4.

Figure 4:
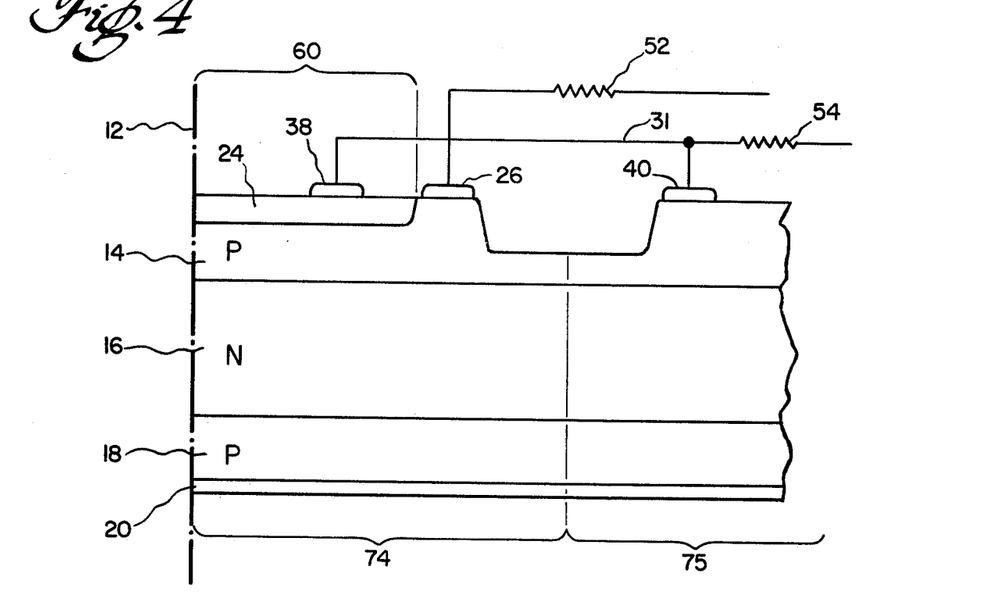
FIG. 4 shows an alternative connection of the contact regions of the amplifying gate thyristor of FIG. 1 to improve the initial current dissipation and di/dt capability of the pilot thyristor.

The devices of FIGS. 1 and 4 are similar except that FIG. 4 shows an alternative arrangement for the interconnection of the first contact region 26, the electrode 38 of the pilot thyristor 29, and the third contact region 40. The arrangement shown in FIG. 4 allows for pilot emitter region 24 to be enlarged by permitting the inner diameter to be reduced to substantially zero. Electrode 38 is positioned at location on n+ layer 24 before the contact region 26 with respect to the centerline 12. Electrode 38 is also connected to contact region 40 by a conductor 31. The positioning of electrode 38 before contact region 26 and the interconnection between electrode 38 and contact region 40 may, if the outer diameter of region 60 is reduced, decrease the dv/dt currents in region 74 and thus the size and area needed for the compensation region 75. Obviously, the area occupied by first contact region 26 should be small.

The dv/dt capability improvement of the main thyristor 44 occurs when the second impedance means 52 is connected to the cathode electrode 32 and is proportional to $A_{94}/(A_{94} - A_{74})$ where $A_{94}$ is the area enclosed by turn-on line 89 of the main thyristor 44. The means for tuning or trimming the dv/dt capabilities of the pilot thyristor 29 is most easily provided by adjusting the impedance value of the first impedance means 54. When arranging device 10 within a circuit it is desirable that the first impedance means 54 ($R_B$) be a variable resistor tuned to give $V_{CR1} - V_{CR3} = 0$ in the presence of a dv/dt transient. Gate sensitivity is most easily adjusted by varying second impedance means 52 ($R_G$). This should, in fact, be done before setting $R_B$.

FIG. 5 shows one example of the first impedance means 55 ($R_b$) and the second impedance means 57 ($R_G$) integrated into the device 10. Contact regions 26 ($CR_1$), 27 ($CR_2$) and 40 ($CR_3$) are represented by shaded areas to thus indicate metallization layers. The pilot thyristor emitter material 24 is represented by an area having a plurality of irregularly spaced circles. The bare p-base layer 14 is shown as a clear area. The conductor 42, connecting annular ring 40 and electrode 38, is shown as a shaded bar extending between contact region 40 and electrode 38. Conductor 42 is separated from isolation means 50 by a layer of insulating material 90 such as oxide or silicon nitride.

The first isolation means 55 ($R_b$) is shown in double cross hatching. The second impedance means 57 ($R_G$) is formed by a constricted path between contact regions 26 ($CR_1$) and 27 ($CR_2$) and is shown stippled to represent the constricted path and is bounded by two outward projections of the first isolation means 50. The impedance of this path may be increased by making it longer, or narrower, or by partially etching into layer 14 to increase the local p-base sheet resistance. The isolation means 50 is shown in single cross hatching as a circular region having projections 92 crossing the compensation region 75. As previously discussed, first impedance means 55 ($R_B$), second impedance means 57 ($R_G$) and isolation means 50 are controlled by appropriate etching of grooves into the top portion 19 of the device 10 combined with the standard geometric factor.

The one drawback of the invention is the fact that when the pilot thyristor turns on, the current it delivers to gate the main stage is limited by first impedance means 55 ($R_B$). This to some degree limits $R_B$. For example, if the gate current of the main stage is desired to be 0.5A and the main stage is to be capable of turn-on at 10 volts and above, the $R_B$ must be no larger than $10/0.5 = 20$ ohms. This may lead to need for a large compensation area for compensation region 75 to provide the proper compensation. However, this restriction on $R_B$ can be removed by connecting a series string of diodes 97 between the second and third contact regions 27 and 40, respectively, as shown in FIG. 3. Now it is only necessary that the total forward voltage drop of series arranged diodes 97, when conducting, is less than 10 volts for the given example. Now when the pilot stage is turned on, the pilot stage current gates the main stage through the diode string 97. However, perfect dv/dt compensation exists only to that value of $V_{CR3}$ at which the diode string 97 begins to conduct. Thus dv/dt improvement would be in this example $10V/V_{THR}$ where $V_{THR}$ is the threshold turn-on voltage of the pilot stage, e.g., 0.4 to 0.8 volts in silicon devices.

It should be appreciated that the herein described device 10 provides the thyristor art with an amplifying gate thyristor having compensation that may be utilized (1) to improve the dv/dt capability of the pilot and main thyristors 29 and 44, respectively, (2) to increase the di/dt capability of the device 10, particularly the pilot thyristor 29, (3) to increase the gate sensitivity of the device 10, (4) to trim or tune the dv/dt capabilities of the pilot and main thyristors 29 and 44, respectively. Additionally, because the compensation effects may be regulated by the choice of a resistor, little area need be taken by the compensation means, such as impedance means 55, and isolation region 75. Consequently, in most present art thyristors, the area enclosed by the main thyristor stage need not be increased. Thus the dv/dt capability of the main thyristor stage would remain unchanged. If, as is well known, conductor 58 and impedance means 52 are inserted as shown in FIG. 1, the main thyristor stage 44 dv/dt capability is increased. It should be noted that in prior art compensation arrangements the area feeding dv/dt current to the main thyristor is the sum of the central region plus a relatively large edge region.

It should now be appreciated that this invention provides the thyristor art with an amplifying gate thyristor that utilizes internal compensation to improve its dv/dt capability, its di/dt capability, and its sensitivity, and also allows for tuning of these characteristics.

While the invention has been particularly shown and described with reference to several preferred embodiments thereof, it will be understood by those skilled in the art that various changes in form and detail may be made therein without departing from the true spirit and scope of the invention as defined by the appended claims. For example, the invention may be applied to an edge gated thyristor, as evidenced by assuming that the centerline and outer edge in the device shown in FIG. 1 are reversed. Moreover, contact regions 26, 27 and 40 need not be circular but may have other convenient shapes. Furthermore, isolation regions may be formed by etching wholly through base layer 14 or by purposely preventing the formation of a base layer 14 during processing in regions where an isolation region is desired. It is, therefore, to be understood that the appended claims are intended to cover all such modifications and changes as fall within the true spirit of the invention.

What is claimed is:

1. An amplifying gate thyristor having a gate region, a pilot thyristor stage, a main thyristor stage, and an anode, each of said pilot thyristor stage and said main thyristor stage including an electrode and an emitter layer affixed to the electrode thereunder, respectively, said electrode of the main thyristor stage, together with the emitter layer thereunder, forming the cathode of the amplifying gate thyristor, said cathode and said anode adapted to be coupled to a relatively high voltage source capable of supplying sufficient dv/dt current to said pilot thyristor to render said pilot thyristor conductive and thus render said amplifying gate thyristor conductive, said amplifying gate thyristor further comprising:

a plurality of contact regions disposed on a top surface thereof and including a first contact region located in said gate region radially inward of said pilot thyristor region, a second contact region located to contact a p-base region of said main thyristor and further comprising the gate electrode of said main thyristor region, a third contact region located between said electrode of said pilot thyristor stage and said second contact region, a conductive element coupling said third contact region to the electrode of said pilot thyristor and a first isolation means situated between said third contact region and said electrode of the pilot thyristor;

a first impedance means including a second isolation means and a first resistive element, said second isolation means situated between said second and third contact regions;

a second impedance means coupled between said first contact region and said cathode; and a compensation region extending between the central portions of said first and said second isolation means for conducting dv/dt current therein.

2. An amplifying gate thyristor according to claim 1 wherein said second isolation means comprises a groove in the top porton of the amplifying gate thyristor between said third and second contact regions.

3. An amplifying gate thyristor according to claim 1 wherein said second impedance means comprises a groove in the top portion of the amplifying gate thyristor between said first contact region and the cathode region of said main thyristor.

4. An amplifying gate thyristor according to claim 1 or 2 wherein said electrode of said pilot thyristor is positioned at a location radially inward of said first contact region.

5. An amplifying gate thyristor according to claim 1 or 2 further including a plurality of series-connected diodes coupled between said third and second contact regions, said plurality of diodes having a total forward voltage drop when in their conductive state substantially equal to the minimum voltage at which it is desired to turn-on said main thyristor stage, thereby reducing the area of the compensation region necessary for improving the dv/dt capabilities of said amplifying gate thyristor, the dv/dt improvement being substantially equal to the total voltage drop across said diodes divided by the threshold turn-on voltage of the pilot thyristor.

* * * * *